United States Patent
Ball (10) Patent No.: US 6,855,623 B2
(45) Date of Patent: Feb. 15, 2005

(54) RECESSED TAPE AND METHOD FOR FORMING A BGA ASSEMBLY

(75) Inventor: Michael Ball, Boise, ID (US)

(73) Assignee: Micron Technology Inc., Boise, ID (US)

(*) Notice: Subject to any disclaimer, the term of this patent is extended or adjusted under 35 U.S.C. 154(b) by 81 days.

(21) Appl. No.: 10/206,518

(22) Filed: Jul. 26, 2002

(65) Prior Publication Data

US 2002/0192936 A1 Dec. 19, 2002

Related U.S. Application Data

(62) Division of application No. 09/256,867, filed on Feb. 24, 1999, now Pat. No. 6,426,564.

(51) Int. Cl.⁷ .............................................. H01L 21/44
(52) U.S. Cl. ..................... 438/612; 438/613; 438/614; 438/616
(58) Field of Search ................... 438/612, 613, 438/614, 616, 617, 615; 257/778, 734, 780, 737

(56) References Cited

U.S. PATENT DOCUMENTS

| 3,320,658 A | 5/1967 | Bolda et al. ............ 29/155.5 |
| 3,396,894 A | 8/1968 | Ellis ............................. 228/56 |

(List continued on next page.)

FOREIGN PATENT DOCUMENTS

| JP | 352063672 | * 5/1977 |
| JP | 01-037367 | 2/1989 |
| JP | 01-099911 | 4/1989 |
| JP | 401308038 | * 12/1989 |
| JP | 05-144938 | * 6/1993 |
| JP | 406136687 | * 5/1994 |
| JP | 08-083819 | 3/1996 |
| JP | 08-293664 | * 5/1996 |
| JP | 08-274048 | * 10/1996 |
| JP | 09-183485 | 7/1997 |
| JP | 10-189666 | * 7/1998 |
| JP | 11-233568 | * 8/1999 |
| JP | 2000072108 | 3/2000 |

OTHER PUBLICATIONS

"SolderQuik (tm) Ball Grid Array (BGA) Preforms", http://www.winslowautomation.com/bga.htm, Winslow Automation, Inc., 3 pages.

Akiyama, S..,et al., "Continuous Formation of CoCr Films on Pen Tape by Facing Targets Sputtering", *IEEE Transactions on Magnetics, 25*, (Sep. 1989),4189–4191.

*Primary Examiner*—Carl Whitehead, Jr.
*Assistant Examiner*—James Mitchell
(74) *Attorney, Agent, or Firm*—Schwegman, Lundberg, Woessner & Kluth, P.A.

(57) ABSTRACT

A system for attaching a plurality of solder balls to an electronic device is disclosed. The system includes, in one embodiment, a heat-resistant tape having a first side comprising a plurality of recesses. The first side of the tape may form an adhesive surface. The recesses are located for registration with a plurality of connection points on the electronic device. The recesses are each adapted to receive and retain a solder ball therein. After placing a solder ball within two or more of the recesses, the first side of the tape may be adhered to the electronic device with the solder balls retained therein. Heating of the solder balls causes them to reflow and adhere to the connection points. After cooling, the tape may be removed, wherein the solder balls remain bonded to the connection points, forming a Ball Grid Array (BGA).

64 Claims, 6 Drawing Sheets

U.S. PATENT DOCUMENTS

| | | | | |
|---|---|---|---|---|
| 3,719,981 A | * | 3/1973 | Steitz | 438/616 |
| 3,744,129 A | | 7/1973 | Dewey, Jr. | 29/624 |
| 3,982,320 A | | 9/1976 | Buchoff et al. | 29/630 R |
| 4,657,137 A | * | 4/1987 | Johnson | 206/714 |
| 4,664,309 A | | 5/1987 | Allen et al. | 228/180.2 |
| 4,668,761 A | | 5/1987 | Aoshima et al. | 528/230 |
| 4,705,205 A | | 11/1987 | Allen et al. | 228/180.2 |
| 4,712,721 A | | 12/1987 | Noel et al. | 228/56.3 |
| 4,802,276 A | | 2/1989 | Bowcutt et al. | 29/739 |
| 4,903,889 A | | 2/1990 | Svendsen et al. | 228/180.2 |
| 4,996,587 A | | 2/1991 | Hinrichsmeyer et al. | 357/74 |
| 5,089,314 A | * | 2/1992 | Masujima et al. | 428/156 |
| 5,194,930 A | | 3/1993 | Papathomas et al. | 257/773 |
| 5,219,117 A | | 6/1993 | Lin | 228/253 |
| 5,385,291 A | | 1/1995 | Latta | 228/180.22 |
| 5,388,327 A | * | 2/1995 | Trabucco | 29/830 |
| 5,431,332 A | * | 7/1995 | Kirby et al. | 228/246 |
| 5,442,852 A | | 8/1995 | Danner | 29/843 |
| 5,462,743 A | | 10/1995 | Turner et al. | 424/448 |
| 5,482,736 A | | 1/1996 | Glenn et al. | 427/96 |
| 5,497,938 A | | 3/1996 | McMahon et al. | 228/253 |
| 5,617,990 A | | 4/1997 | Thompson, Sr. | 228/180.1 |
| 5,658,827 A | * | 8/1997 | Aulicino et al. | 228/180.22 |
| 5,685,477 A | | 11/1997 | Mallik et al. | 228/254 |
| 5,704,536 A | | 1/1998 | Chen et al. | 228/41 |
| 5,716,222 A | | 2/1998 | Murphy | 429/91 |
| 5,736,456 A | | 4/1998 | Akram | 438/614 |
| 5,783,461 A | | 7/1998 | Hembree | 438/17 |
| 5,796,590 A | | 8/1998 | Klein | 361/774 |
| 5,861,323 A | | 1/1999 | Hayes | 438/111 |
| 5,880,017 A | * | 3/1999 | Schwiebert et al. | 438/613 |
| 5,890,915 A | | 4/1999 | Reylek | 439/91 |
| 5,917,700 A | | 6/1999 | Clemens et al. | 361/704 |
| 5,950,908 A | * | 9/1999 | Fujino et al. | 228/248.1 |
| 5,976,965 A | * | 11/1999 | Takahashi et al. | 438/616 |
| 6,003,670 A | * | 12/1999 | Beer | 206/459.5 |
| 6,025,258 A | * | 2/2000 | Ochiai et al. | 438/613 |

\* cited by examiner

RECESSED TAPE AND METHOD FOR FORMING A BGA ASSEMBLY

This application is a Divisional of U.S. application Ser. No. 09/256,867, now U.S. Pat. No. 6,426,564, filed Feb. 24, 1999.

TECHNICAL FIELD

This invention relates generally to semiconductor fabrication and, more specifically, to a system for accurately positioning and securing solder balls to a semiconductor device to form a Ball Grid Array (BGA) thereon.

BACKGROUND OF THE INVENTION

As demand for smaller, more powerful electronic devices grows, semiconductor manufacturers are constantly attempting to reduce the size and cost of semiconductor packaging. Smaller packages equate with higher semiconductor mounting densities and higher mounting densities allow for more capable yet more compact devices.

With conventional packaging methods, a semiconductor die or "chip" is encapsulated in a ceramic or plastic package having a number of electrical leads extending therefrom. The leads permit electrical connection between external components and the circuits on the die. Although these packages have proven reliable, they are generally many times larger than the actual die. In addition, the configuration of these packages typically yields only a limited number of leads. For these reasons, conventional packaging techniques are not particularly adaptable to miniaturization.

As a result, recent developments in semiconductor packaging have led to more efficient chip packages. For example, "pin grid arrays" or PGAs utilize a series of pins extending from an entire face of the die (or other electronic device). The pins are electrically connected by traces or bond wires to the electrical circuits on the die. Electrical interconnection is produced by inserting the array of pins into mating sockets on a receiving component. While PGAs provide increased electrical interconnection density, the pins forming the PGA are fragile and easily bent. In addition, the PGA is relatively expensive to produce.

Similar to the PGA is the "ball grid array" or BGA. Instead of pins, the BGA has an array of solder bumps or balls attached to one side of the semiconductor device. The array of solder bumps is adapted to mate with a receiving component wherein the package may be subsequently heated to partially liquefy or "reflow" the bumps, thus forming electrical connections at the discreet ball locations. Like the PGA, the BGA improves conductor density by utilizing the entire device face for electrical interconnection. The present invention is directed primarily to BGAs and the remainder of this discussion will focus on the same.

While BGAs have proven reliable, there are known problems. Primarily, current procedures used to attach the solder balls are expensive or otherwise not conducive to high volume, low cost manufacturing. For instance, one method of solder ball attachment involves an automated robotic arm that picks up individual solder balls, applies a flux thereto, and precisely places the balls at the correct locations on the device. Heat is then applied to reflow the solder balls and thus secure the balls to the device. While effective, this method requires highly specialized and expensive machinery. Furthermore, the machine must be reconfigured for each BGA pattern.

Another method for locating and attaching solder balls to form a BGA uses a fixture having a stencil or silk screen overlay with a series of apertures corresponding to the desired ball locations or bond pads on the device. After the stencil is brought into registration with the electronic device, flux is applied through the apertures to coat the bond pads. A solder paste is then squeegeed over the stencil, filling the apertures. Due to the relative viscosities of the flux and paste, the paste adheres temporarily to the flux-covered bond pads. To avoid adhesion to the stencil, it is typically made from a non-wettable material. The stencil is then removed and the assembly is heated to reflow the solder paste wherein the paste forms a solder ball at each location. Alternatively, the stencil may remain until after reflow.

Like the robotic machines, solder paste techniques are not without problems. One particular problem with solder paste is that ball placement density or "pitch" is limited by the viscosity of the solder paste. In particular, the paste can flow outwardly from its intended bond pad once the stencil is removed. In addition, fine pitch stencils can accommodate only limited solder volume, restricting the size of the resulting ball. Furthermore, the process of applying the solder paste to the stencil is time consuming and difficult to completely and efficiently automate.

A variation of the paste method involves placing solder balls instead of solder paste into the stencil. Here, the electronic device and the stencil may be placed into an alignment fixture. A plurality of solder balls may then be placed over the stencil. By agitating the fixture, the solder balls "drop into" the apertures and are temporarily retained in the layer of flux on each bond pad. Like the solder paste techniques described above, the balls may be reflowed to attach to the bond pads. Unfortunately, this method of attachment is also time consuming and difficult to automate.

Yet another method of solder ball placement uses a flexible carrier or preform having embedded solder balls therein. With the assistance of an alignment fixture, the preform is brought into edge registration with the electronic device. The preform may then be reflowed to secure the embedded solder balls to the device. While effective in overcoming some of the stencil problems, removal of the carrier requires an aqueous rinse or manual removal procedures. For this and other various reasons, the preform attachment method is used primarily in low volume applications.

Another method of solder ball placement is described in U.S. Pat. No. 5,861,323 issued to Hayes on Jan. 19, 1999. Hayes describes a insulating membrane holding an array of solder balls wherein the solder balls protrude through both sides of the membrane. The membrane is then precisely placed between two components and the solder reflowed. While effective, Hayes requires that the membrane and both electronic components be held in precise alignment during reflow. Furthermore, the membrane remains in place between the two components after solder reflow.

Still yet another method of solder ball placement is shown in U.S. Pat. No. 5,219,117 issued to Lin on Jun. 15, 1993. Lin discloses a transfer substrate having a plurality of recesses which align with bond pads on a semiconductor device. While overcoming some of the problems with the other attachment techniques, the transfer substrate does not positively retain the solder balls after insertion into the recesses. Accordingly, the substrate must be carefully handled prior to reflow to prevent dislodging of the balls from the substrate. Furthermore, the method described by Lin does not secure the transfer substrate to the semiconductor device prior to reflow. As such, the substrate and device must be held in precise alignment by external means during reflow.

Accordingly, what is needed is a system of locating and securing solder balls in a manner that is conducive to high volume BGA production. What is further needed is a system which can economically and reliably position the solder balls on a high density (fine pitch) semiconductor device and secure the balls thereto until subsequent reflow.

SUMMARY OF THE INVENTION

A heat-resistant tape and method of using the tape to locate and secure a plurality of solder balls to an electronic component is described herein. The method comprises providing a heat-resistant tape having a first side with an adhesive coating applied to the first side to form a first adhesive surface. The tape also has a plurality of blind recesses formed on the first side wherein each blind recess has a second adhesive surface therein. A solder ball is placed into two or more of the blind recesses wherein the solder balls adhere to the second adhesive surface. The first side of the tape is then secured to an electronic component having a plurality of connection points, wherein the two or more blind recesses are aligned with two or more of the connection points.

In one embodiment, the heat resistant tape comprising a first side forming a first adhesive surface, wherein a plurality of blind recesses are formed on the first side. In addition, each blind recess has a second adhesive surface adapted to retain a solder ball within the blind recess.

In another embodiment, a heat-resistant tape is described comprising a first side having a first adhesive surface adapted to adhere to the face of an electronic component. The tape further comprises a plurality of blind recesses located on the first side where each blind recess is adapted to receive a solder ball such that the solder ball does not extend beyond the first side. Each blind recess also has a second adhesive surface adapted to retain the solder ball within the blind recess.

In yet another embodiment, a heat-resistant tape for securing a plurality of solder balls to a semiconductor device is described comprising a first layer having a first side, a second side, and a plurality of perforations therebetween. Furthermore, the tape has a second layer having a first side where the first side of the second layer is laminated to the second side of the first layer such that the plurality of perforations form a plurality of blind recesses each adapted to receive and retain a solder ball therein.

In still yet another embodiment, a pre-assembled BGA assembly is described comprising a semiconductor device having a face defining a series of electrical connection points. The pre-assembled BGA assembly further includes a tape segment having a first side secured to the face of the semiconductor device where the first side of the tape segment comprises a plurality of blind recesses generally aligned with the series of electrical connection points. Located within each blind recess is a solder ball in close proximity to the electrical connection point.

Advantageously, the present invention provides an efficient and reliable tape for producing BGA assemblies in high volume. By patterning the tape to match the specific array of bond pads, the present invention also provides an accurate method of placing a plurality of solder balls relative to a semiconductor device to form most any BGA configuration including fine pitch grids. Furthermore, the tape and method described herein avoid the problems of stencil/solder paste and other conventional placement techniques. The tape also provides a convenient way to secure the solder balls to the tape and the tape to the semiconductor device.

BRIEF DESCRIPTION OF THE DRAWINGS

The invention described herein will be further characterized with reference to the drawings, wherein.

DETAILED DESCRIPTION OF THE EMBODIMENTS

In the following detailed description, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

The invention is generally directed to an improved system for locating and attaching solder balls to an electronic assembly or component such as a semiconductor device to form a ball grid array (BGA) thereon. The system comprises a tape having a first side which includes a plurality of blind recesses adapted to receive a solder ball therein. After filling the recesses, the first side of the tape may be secured to the electronic component wherein the plurality of recesses are in registration with a plurality of connection points on the component. The solder balls may then be heated until they reflow and attach to the connection points. Due to the surface tension characteristics of conventional solder materials, the balls remain spherical and tend to center on the connection points when heated. Once the solder balls are secured, the tape may be removed from the component, leaving it with the BGA formed thereon. Accordingly, the present invention provides a system for placing and securing solder balls wherein the system is adaptable to high volume production.

Figure 1:
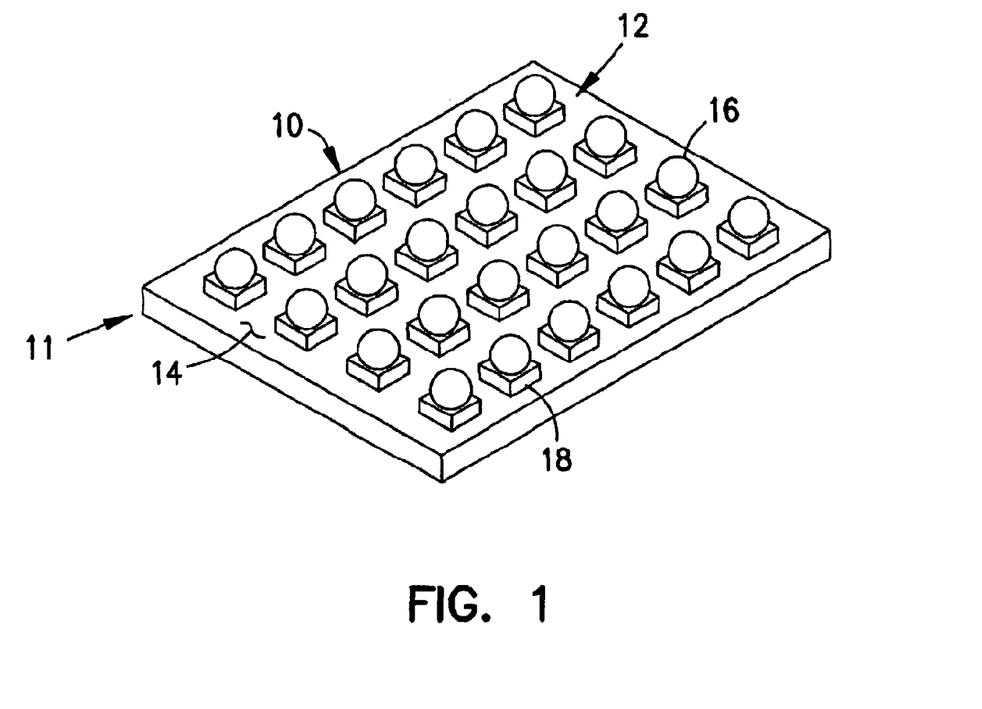
FIG. 1 is an perspective view of an BGA assembly comprising a semiconductor device having a BGA formed thereon in accordance with one embodiment of the invention.

With this brief introduction, various embodiments of the invention will now be described with reference to the figures. Referring first to FIG. 1, an electronic component 10 according to one exemplary embodiment of the invention is shown. Attached to a face 14 of the component is a BGA 12. The BGA 12 is formed by the attachment of solder balls 16 to discreet connection points or bond pads 18 on the face 14. The bond pads are positioned in a particular array to effect efficient connection to the circuits on the face of the component 10. The pads 18 may be flush or alternatively protrude from the face 14 as shown. Once attached, the device 10 and solder balls 16 form a BGA assembly 11.

Figure 2:
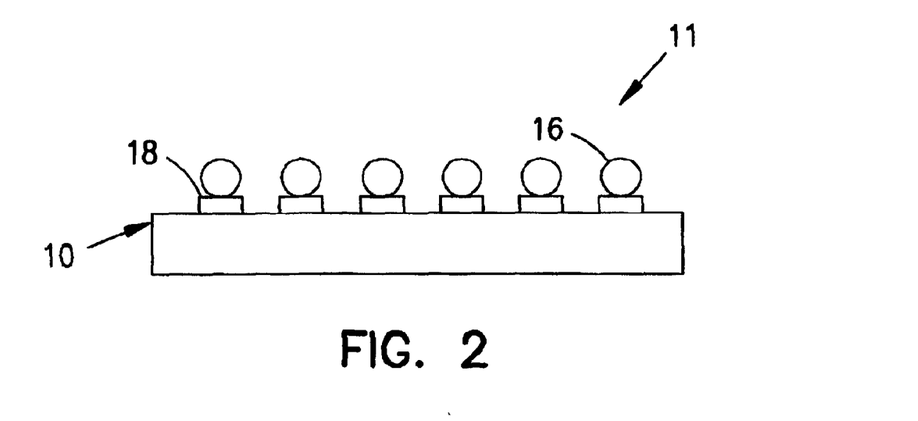
FIG. 2 is a side view of the BGA assembly of FIG. 1.
Figure 3:
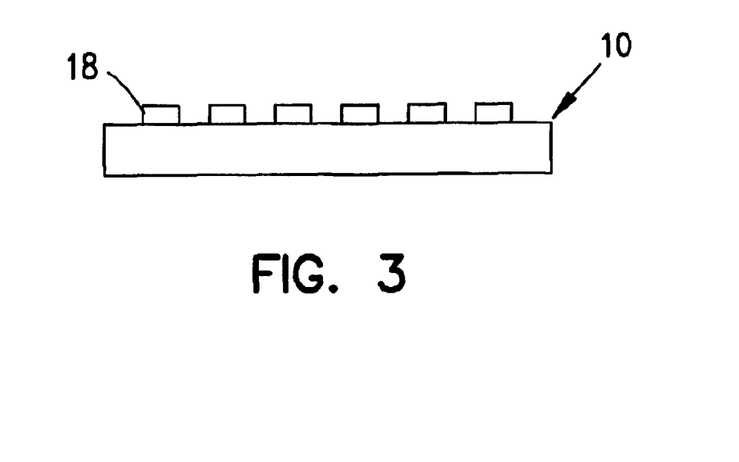
FIG. 3 is side view of a semiconductor die in accordance with one embodiment of the invention before attachment of the solder balls.

Referring now to FIGS. 2 and 3, side views of the BGA assembly 11 and the electronic component 10 (the latter shown prior to attachment of the solder balls 16) are respectively shown. In these figures, the bond pads 18 and the solder balls 16 are clearly illustrated. For purposes of this discussion, the electronic component will be hereinafter referred to as a semiconductor die 10. However, this invention is equally applicable to other devices that may utilize a BGA including, for example, PCB substrates and other integrated circuit (IC) devices. Furthermore, the invention is not limited to semiconductor devices or, for that matter, to electronic components in general. Rather, it may be used to locate and secure reflowable material in most any discreet pattern and on most any surface.

Figure 4:
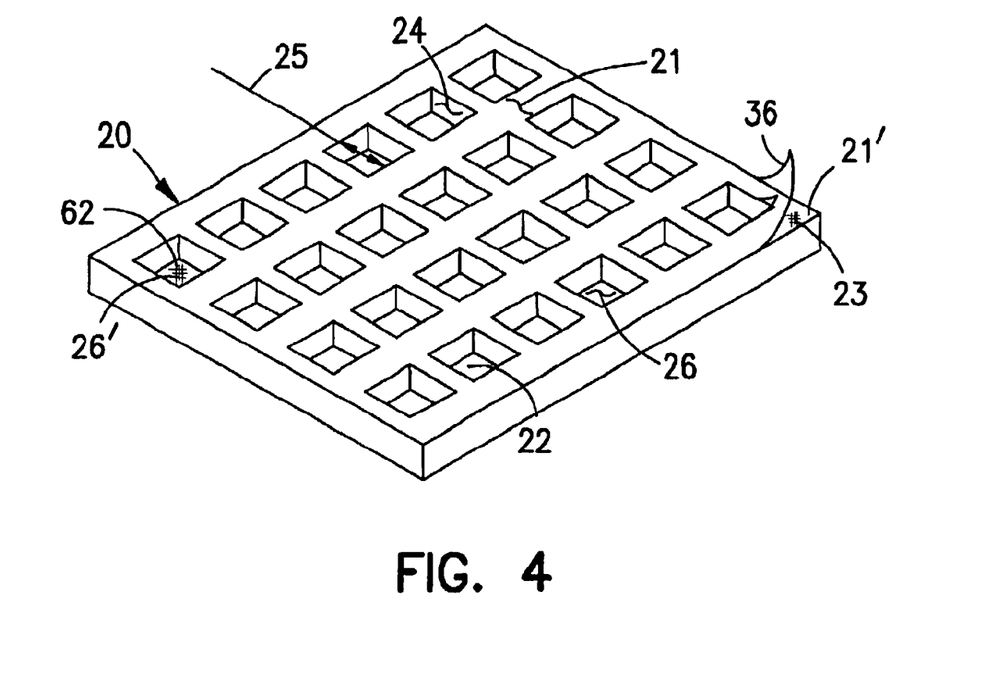
FIG. 4 is a perspective view of a tape segment in accordance with one embodiment of the invention.

FIG. 4 illustrates a heat-resistant film or tape segment 20 in accordance with one exemplary embodiment of the invention. The term "tape segment" is used herein to denote a piece or portion of tape adapted to secure a plurality of solder balls 16 to a single die 10. The tape segment 20 has a first side 21 having a plurality of pockets or blind recesses 22 each adapted to receive a solder ball 16 (not shown) therein. Each blind recess 22 has at least one interior surface. In one embodiment, one or more side surfaces 24 and one or more blind surfaces 26 define the interior surfaces of the recess. While the recesses 22 are shown generally throughout the figures as rectangular (in the plan view), other shapes (e.g., circular, triangular, conical, or other shapes) are also possible without departing from the scope of the invention. In one embodiment, each blind recess comprises four planar side surfaces 24 and one planar blind surface 26 as shown in FIG. 4. The blind surface may be located a sufficient depth below the first side 21 that a solder ball placed therein does not protrude beyond the first side 21. Alternatively, the recess depth may place the solder ball 16 so that it is flush with or protrudes slightly from the first side 21.

Referring still to FIG. 4, The tape segment is die-specific so that, if placed in registration with the die 10, one blind recess 22 corresponds precisely with one bond pad 18. The first side 21 of the tape segment 20, in one embodiment, is coated with a first adhesive 23 to permit lamination of the tape segment 20 to the die face 14. The adhesive 23 remains thermally stable even at solder reflow temperatures (i.e., the temperature necessary to cause solder materials to liquefy). That is, the adhesive 23 will not separate or "delaminate" from the die 10 during solder reflow. Nor will it burn, melt, or breakdown. For clarity, the first side 21 with the adhesive 23 applied thereto will be hereinafter referred to as the first adhesive surface 21'.

To protect the first adhesive surface 21' until lamination with the die 10, a removable liner 36 as shown in FIG. 4 may be included. The liner 36 is a thin flexible layer covering the first adhesive surface 21'. The liner has a plurality of perforations that align with the blind recesses 26. Accordingly, when the liner 36 is in place, access to the recesses is not impeded. Before the tape segment 20 is laminated to the die 10, the liner 36 may be removed, exposing the first adhesive surface 21' underneath.

Each blind recess 22 is sized to receive and retain a single solder ball 16 as further described below. Accordingly, each recess includes a recess opening 25 of sufficient size to accommodate one solder ball. The recess is located and sized to position the solder ball in close proximity to the bond pad when the tape segment 20 is secured to the die 10. However, it is not critical that the recess precisely align the ball with the center of the bond pad (i.e., the blind recess may be slightly larger than the solder ball). The reflow properties of the solder will generally cause the ball to centrally attach to the bond pad. In one embodiment, the blind recess 22 includes another adhesive coating 62 (discussed in more detail below) applied to one or more of the interior surfaces 24, 26 to form a second adhesive surface. In one embodiment, the adhesive coating is located on the surface 26 such that the blind surface 26 forms the second adhesive surface. To simplify the remaining discussion, the blind surface 26 with the adhesive 62 will be denoted the second adhesive surface 26'. The second adhesive surface 26' adhesively retains each solder ball 16 in its respective blind recess 22.

While the tape segment 20 may be comprised of various materials, it is, in one embodiment, made from one or more layers of polyimide film. Polyimide film is available under various trade names such as UPILEX® (commercially available from UBE Industries Ltd) or KAPTON® (available from Dupont). Polyimide film is able to withstand thermal processing temperatures in excess of those required for conventional solder reflow. In addition, polyimide and the adhesive coating 23 are able to withstand the thermal stresses induced by thermal expansion mismatch between the die 10 and the tape segment 20 during reflow. Furthermore, polyimide is non-wettable (i.e., solder materials will not adhere thereto). Thus, the solder balls will not attach to the interior surfaces 24, 26 during reflow. While described herein with reference to a polyimide film, other heat-resistant materials (e.g., glass, silicon) are equally within the scope of the invention.

Figure 5:
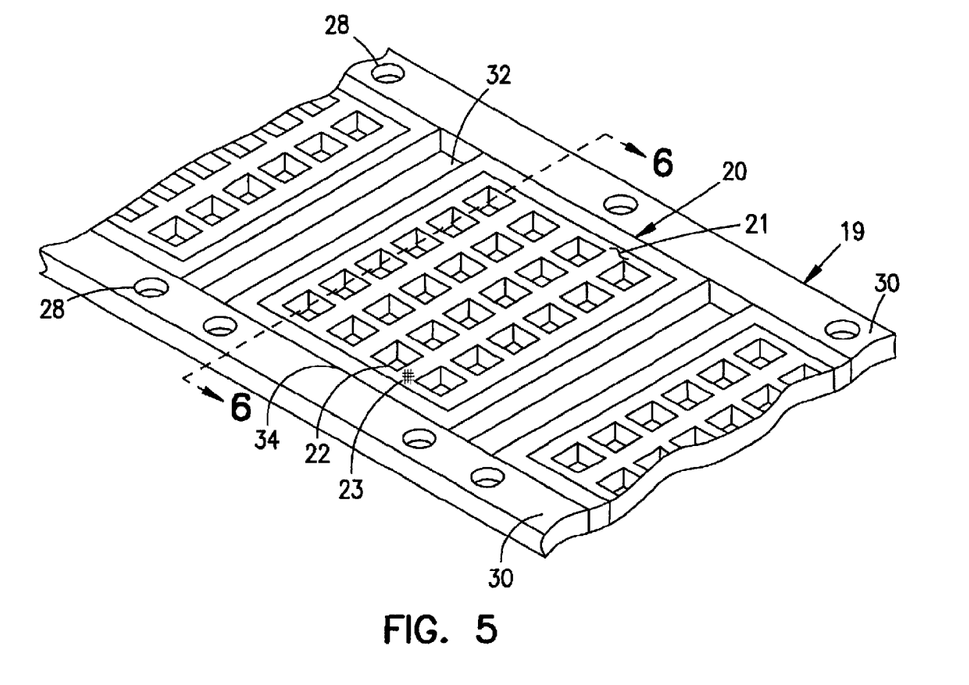
FIG. 5 is a perspective view of a sheet having a plurality of tape segments constructed in accordance with one embodiment of the invention.

The tape segment 20 may be provided in a variety of configurations and forms. For example, the tape segments may be formed individually for attachment to individual dies (see FIG. 4). Alternatively, multiple tape segments may be formed from a larger, unitary piece of tape. As an example of the latter, the tape segments 20 may be formed on a strip or sheet 19 as shown in FIG. 5 to facilitate automated assembly. The sheet 19, in one embodiment, includes side rails 30 incorporating indexing features or holes 28 that permit the sheet to be precisely located during processing. The sheet 19 is formed into a series of tape segments 20 each adapted to accommodate a single die 10. Separating each tape segment 20 is a slot 32. The slot 32, along with a pair of opposing shear lines 34, permit the tape segment 20 to be separated from the sheet 19. The tape segments may be separated at any point in the process (e.g., before or after attachment to the die 10).

Figure 6:
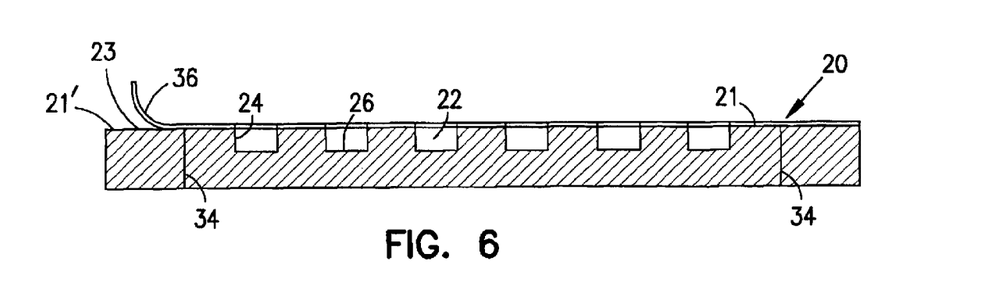
FIG. 6 is a cross sectional view of one tape segment taken along lines 6—6 of FIG. 5.

FIG. 6 shows a cross-sectional view of the tape segment 20. The recesses 22, including the side surfaces 24 and the blind surfaces 26, are clearly visible. While the particular construction of the tape segment 20 is not perceived to be critical, one exemplary embodiment of the tape will now be described with reference to FIG. 7. Here, the tape segment 20 comprises a laminate of two layers. A first layer 50 is defined by the first side 21 and a second side 52. The adhesive coating 23 applied to the first side 21 forms the first adhesive surface 21'. The removable liner 36 protects the first adhesive surface 21' until lamination with the die 10. A series of perforations 54 are formed through the first layer 50 and the liner 36. Like the blind recesses 22 which they ultimately form, the perforations 54 are patterned to match a specific array of bond pads 18 (see FIG. 1). The perforations may be formed in the first layer by any number of conventional techniques including, for example, punching, etching or laser cutting.

Figure 7:
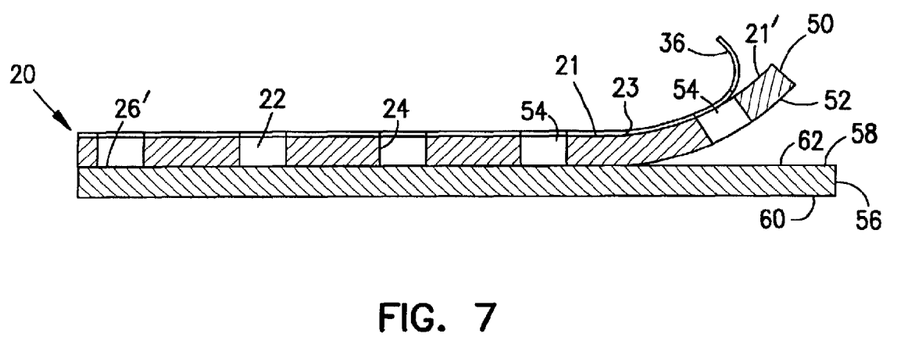
FIG. 7 is a sectional view of a tape segment constructed in accordance with another embodiment of the invention.

Laminated to the second side 52 of the first layer 50 is a second layer 56. Unlike the first layer 50, the second layer 56 has no perforations therein. The second layer 56 has a first side 58 which laminates to the second side 52 of the first layer 50. The two layers may be laminated by a variety of conventional methods including heat and/or pressure processes. In one embodiment, the first side 58 of the second layer 56 comprises the second adhesive coating 62 for laminating the second layer 56 to the first layer 50. Like the first adhesive coating 23, the second adhesive coating 62 will not allow separation or "delamination" of the layers during solder reflow.

When laminated, the first side 58 of the second layer 56 forms the blind surface 26 (and thus, with the adhesive coating 62, the second adhesive surface 26'). The second adhesive surface 26' secures the solder balls 16 as further described below.

Once the two layers 50, 56 are laminated, the tape segment 20 as shown in FIG. 4 is formed. Alternatively, the sheet 19 of FIG. 5 may be formed by joining a length of layers 50 and 56. Conventional tape punching processes may be used to produce features such as the indexing holes 28 and the shearing slots 32.

While discussed above with reference to a two-layer tape, other tape configurations (e.g., single layer, trilayer) are also possible without departing from the scope of the invention.

Having described various embodiments of the tape, a method of positioning and attaching the solder balls to form a BGA assembly according to one embodiment of the invention will now be described. One exemplary embodiment of the attachment method according to the invention is illustrated in FIGS. 8A–8F. While the method is described herein in a particular order, it is noted that the various procedures may be rearranged to some degree to better accommodate manufacturing processes.

Figure 8A:
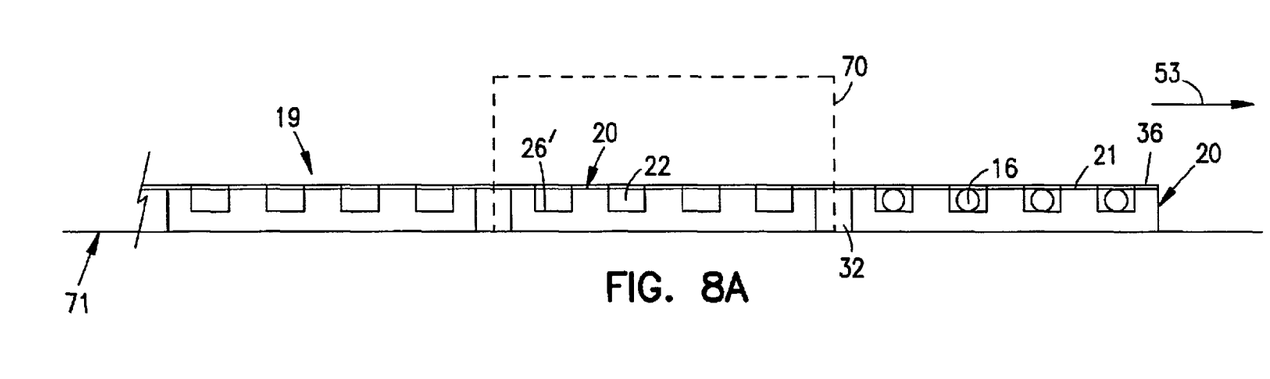
FIGS. 8A–8F are schematic side elevation views illustrating the steps for attaching solder balls to form a BGA in accordance with one embodiment of the present invention.

With reference to FIG. 8A, the tape segment 20 is shown as incorporated into the sheet 19. To facilitate movement of the sheet in automated machinery, it may be coupled to a generic conveyor system 71 with the first side 21 facing upwards. The conveyor system may move the sheet from one location to the next along a direction 53. Alternatively, the sheet 19 may remain stationary while the various processing equipment (described below) moves relative thereto. The indexing holes 28 may be used to precisely locate the tape at various stations during processing.

As shown in FIG. 8A, the tape may first pass through ball placement apparatus 70 which deposits the solder balls 16 into the blind recesses 22. Since the ball placement apparatus 70 is not central to the invention, it is not described in detail herein. However, conventional techniques known in the art can be effectively employed to place solder balls within the recesses. For instance, in one embodiment, a container filled with solder balls is located above the conveyor 71. When the segment 20 is beneath the placement apparatus 70, solder balls are applied in quantity to the first side 21. Since the recesses are sized appropriately, one solder ball fills each recess. The liner 36 prevents the solder balls from adhering to the first adhesive surface 21'. The excess solder balls may be removed from the first side 21 through a variety of mechanical means including tilting or agitation of the tape segment 20 or forcing air across the first side.

Alternatively, the apparatus 70 may utilize a stencil fixture (not shown) having a series of apertures wherein the stencil fixture may be placed over the tape segment 20 such that the stencil apertures align with the recesses 22. The solder balls 16 may then be placed in quantity over the stencil fixture whereby a single ball falls into each aperture and fills each blind recess 22 of the tape segment 20. The excess solder balls and the stencil are then removed, leaving one solder ball in each recess.

Other techniques for placing the solder balls are also contemplated within the scope of the invention. For example, the apparatus 70 may utilize a conventional pick and place machine or other automated or manual equipment.

Regardless of the placement means used, the tape segments emerge with the blind recesses filled as shown in FIG. 8A. The second adhesive surface 26' secures each solder ball 16 in place. Conventional pattern recognition techniques may be used to determine that each recess is filled.

Figures 8B, 8C:
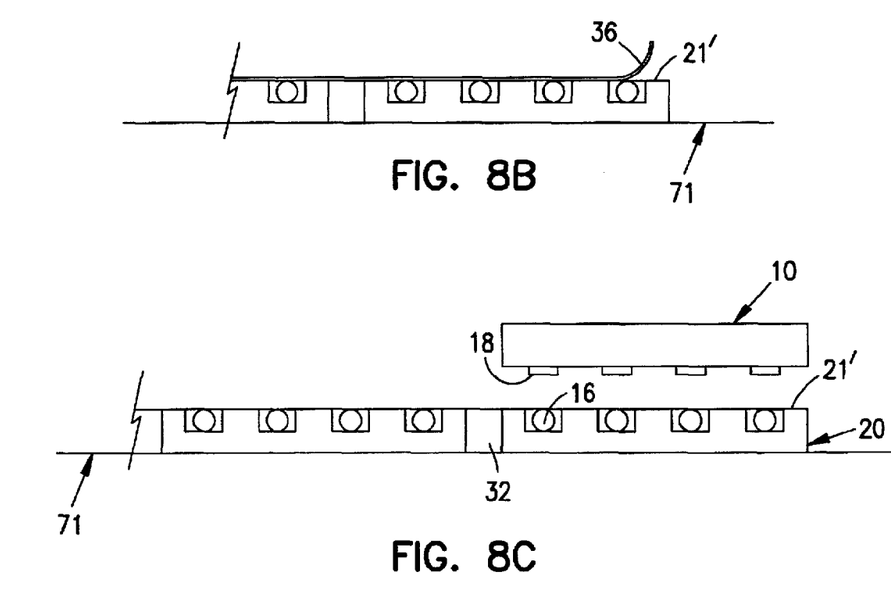
Figure 8D:
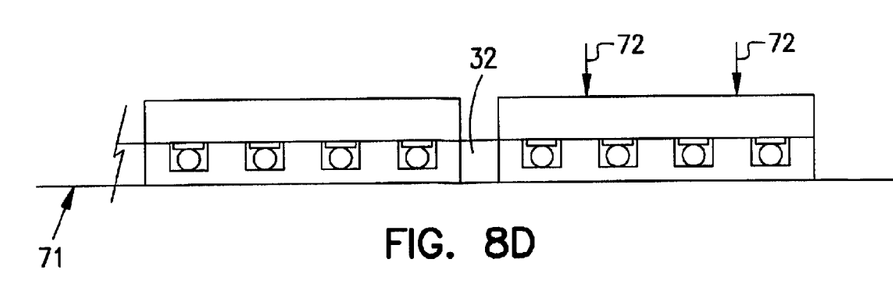

Once the tape segment 20 has received the solder balls 16, the liner 36 may be removed from the first side 21 as shown in FIG. 8B, exposing the first adhesive surface 21'. With the liner removed, the tape segment moves to a die attach station. Before attaching the die 10 to the tape segment 20, the bond pads 18 may be coated with flux to promote bonding with the solder balls 16. The die 10 is then brought into registration with the tape segment 20 as shown in FIG. 8C using conventional alignment methods (e.g., optical location, edge registration, etc). Once aligned, the die 10 is placed into contact with the tape segment 20 as shown in FIG. 8D. While illustrated with the tape below the die, the components may be flipped (the die 10 could be brought upwardly into contact with a downwardly facing tape segment 20) as the adhesive layer 62 will retain the solder balls within the blind recesses. Once the die 10 and tape 20 are coupled, a solder ball 16 is located in contact with or in close proximity to each bond pad 18 as shown in FIG. 8D. The dimensions of the recesses 22 and the bond pads 18 may be such that the solder balls and the bond pads 18 contact. Alternatively, a clearance may exist therebetween. In the case of contact, the tape segment 20 may deform to permit contact between the first adhesive surface 21' and the die 10.

To ensure that the die 10 is secured to the tape segment 20, a slight compressive force 72 may be applied to the tape segment and the die as indicated by the arrow 72 in FIG. 8D. Alternatively, the adhesive 23 may be temperature activated. In the case of the latter, the adhesive 23 may be a resin that laminates at a temperature below the solder reflow temperature but does not soften or delaminate during the subsequent reflow process.

Once the tape segment 20 is secured to the die 10, the solder balls 16 are securely held in place (either in contact or in close proximity to the bond pads 18). If desired, the dies (with the tape attached) may be separated from the film 19 along the shear slots 32 and the shear lines 34. The die 10 and the tape segment 20 with the solder balls sandwiched therebetween may then remain secured as a preassembled BGA assembly until subsequent reflow.

Figure 8E:
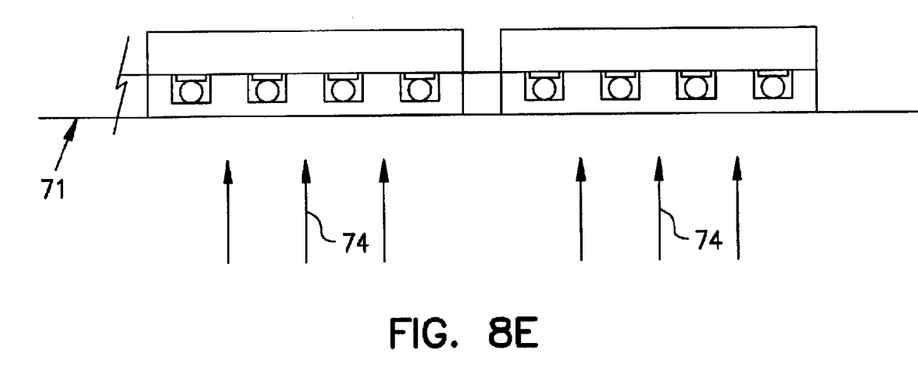

The combined tape and die may be subjected to heat 74 sufficient to reflow the solder balls 16 as shown in FIG. 8E. As previously stated, the tape segment 20 and the adhesives 23 and 62 are adapted to remain thermally stable during reflow.

As the solder reflows, the balls 16 bond to the bond pads 18. Due to the surface tension of the liquid solder, the spherical shape of the balls remains intact during reflow and the solder attempts to center itself on the bond pad 18. Depending on the proximity of the solder balls to the bond pads, the time and temperature of the reflow cycle may be varied to ensure adequate bonding.

Figure 8F:
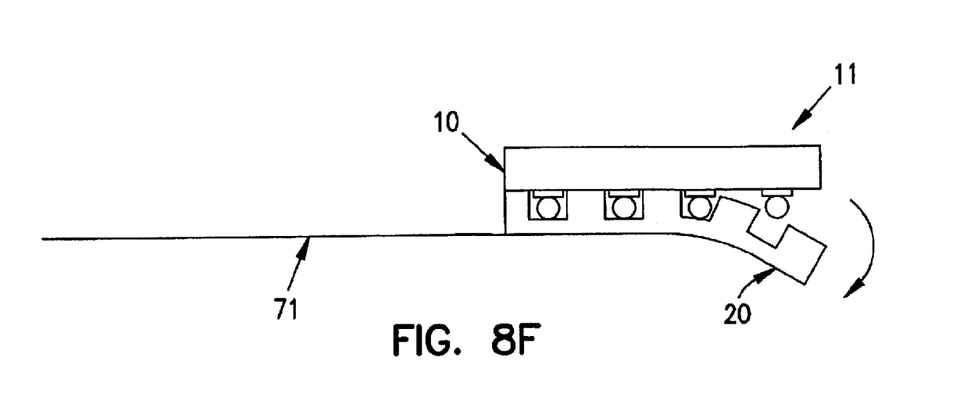

After cooling, the tape segment 20 may be removed from the die 10 as shown in FIG. 8F. Since the bond strength of the solder balls 16 to the pads 18 is greater than the bond strength of the ball to the adhesive 62, the balls remain with the die as the tape is removed. Accordingly, the BGA assembly 11 is formed having the desired BGA formed thereon.

Advantageously, the present invention provides an efficient and reliable tape for producing BGA assemblies in high volume. By patterning the tape to match the specific array of bond pads, the present invention also provides an accurate method of placing a plurality of solder balls relative to a semiconductor device to form most any BGA configuration including fine pitch grids. Furthermore, the tape and method described herein avoid the problems of stencil/solder paste and other current placement techniques. The tape also provides a convenient way to secure the solder balls to the tape and the tape to the semiconductor device.

Exemplary embodiments of the present invention are described above. Those skilled in the art will recognize that many embodiments are possible within the scope of the invention. Variations and modifications of the various parts and assemblies can certainly be made and still fall within the scope of the invention. Thus, the invention is limited only by the following claims, and equivalents thereto.

What is claimed is:

1. A method for attaching solder balls to an electronic component comprising:
    providing a heat-resistant tape, the tape having:
        a first side having a plurality of blind recesses in the tape;
        an adhesive coating applied to the first side to form a first adhesive surface, each blind recess having a second adhesive surface therein;
    inserting a solder ball into two or more blind recesses wherein the solder balls adhere to the second adhesive surface; and
    securing the first side of the tape by the first adhesive surface to an electronic component having a plurality of connection points, wherein the two or more blind recesses are aligned with two or more connection points.

2. The method of claim 1, further comprising:
    heating the solder balls to a temperature at which they reflow and bond to the connection points;
    cooling the solder balls; and
    removing the tape from the electronic component whereby the solder balls remain attached to the connection points to form a BGA.

3. The method of claim 1, wherein the method further includes separating a removable liner covering the first adhesive surface prior to securing the first side of the tape to the electronic component.

4. The method of claim 1, wherein securing the first side of the tape to an electronic component includes applying a compressive force to the tape and the electronic component.

5. The method of claim 1, wherein inserting a solder ball into two or more blind recesses includes inserting a solder ball using a ball placement apparatus, wherein a solder ball that deposits on the first side outside a blind recess is removed by mechanical means.

6. A method for attaching solder balls to a semiconductor device comprising:
    providing a heat-resistant polyimide tape, the polyimide tape having:
        a first side having a plurality of blind recesses in the tape;
        an adhesive coating applied to the first side to form a first adhesive surface, each blind recess having a second adhesive surface therein;
    inserting a solder ball into two or more blind recesses wherein the solder balls adhere to the second adhesive surface;
    securing the first adhesive surface of the polyimide tape by the first adhesive surface to a semiconductor device having a plurality of connection points, wherein the two or more blind recesses are aligned with two or more connection points;
    heating the solder balls to a temperature at which they reflow and bond to the connection points;
    cooling the solder balls; and
    removing the polyimide tape from the semiconductor device whereby the solder balls remain attached to the connection points to form a BGA.

7. The method of claim 6, wherein seeming the first adhesive surface of the polyimide tape to a semiconductor device includes applying a compressive force to the polyimide tape and the semiconductor device.

8. The method of claim 6, wherein securing the first adhesive surface of the polyimide tape to a semiconductor device includes heating the first side to a temperature below the solder reflow temperature.

9. A method for attaching solder balls to a semiconductor device comprising:
    providing a heat-resistant tape, the tape having:
        a first side having a plurality of blind recesses in the tape;
        an adhesive coating applied to the first side to form a first adhesive surface, each blind recess having a second adhesive surface therein;
        a removable liner coveting the first adhesive surface; and
    inserting a solder ball into two or more blind recesses wherein the solder balls adhere to the second adhesive surface;
    removing the liner from the first side, exposing the first adhesive surface;
    securing the first adhesive surface by the first adhesive surface to the semiconductor device, the device having a plurality of bond pads, wherein the plurality of blind recesses align with the plurality of bond pads;
    heating the semiconductor device to a temperature which reflows the solder balls; and
    removing the tape from the semiconductor device whereby the solder balls remain attached to the plurality of bond pads.

10. The method of claim 9, wherein the method further includes coating the bond pads with flux prior to securing the first adhesive surface to the semiconductor device.

11. The method of claim 9, wherein securing the first adhesive surface to the semiconductor device includes applying a compressive force to the tape and the semiconductor device.

12. The method of claim 9, wherein securing the first adhesive surface to the semiconductor device includes heating the first side to a temperature below the solder reflow temperature.

13. A method for attaching solder balls to a semiconductor device comprising:
    providing a heat-resistant tape, the heat-resistant tape having first adhesive surface, the first adhesive surface having a plurality of blind recesses in the tape formed in the first adhesive surface, each blind recess having a second adhesive surface therein;
    inserting a solder ball into a recess, wherein the solder ball adheres to the second adhesive surface;
    performing pattern recognition on the tape to determine if each recess that is to be filled with a solder ball is so filled;

securing the first adhesive surface by the first adhesive surface to the semiconductor device, the device having a plurality of bond pads, wherein each blind recess containing a solder ball aligns with a bond pad;

heating the solder ball to a temperature which reflows the solder balls; and separating the tape from the semiconductor device.

14. The method of claim 13, wherein the method further includes separating a removable liner covering the first adhesive surface prior to securing the first adhesive surface to the semiconductor device.

15. The method of claim 13, wherein securing the first adhesive surface to the semiconductor device includes applying a compressive force to the tape and the semiconductor device.

16. The method of claim 13, wherein securing the first adhesive surface to the semiconductor device includes heating a temperature activated coating of the first adhesive surface to a temperature below the solder reflow temperature.

17. Th method of claim 13, wherein the method further includes coating the bond pads with flux prior to securing the first adhesive surface to the semiconductor device.

18. A method for attaching solder balls to semiconductor devices comprising:

providing a sheet having a plurality of heat-resistant tape segments, each tape segment having a first adhesive surface, the first adhesive surface having a plurality of blind recesses in the tape segment formed in the first adhesive surface, each blind recess having a second adhesive surface therein;

inserting a solder ball into a blind recess of each tape segment, wherein the solder ball adheres to the second adhesive surface;

providing a plurality of semiconductor devices, each semiconductor device having a plurality of bond pads;

securing each semiconductor device to the first adhesive surface of a tape segment, wherein each bond pad of each semiconductor device is aligned with a blind recess of a tape segment containing a solder ball, wherein each tape segment is adapted to secure to one semiconductor device; and heating the solder balls to a temperature at which they reflow and bond to the bond pads.

19. The method of claim 18, wherein the method further includes coating the bond pads with flux prior to securing each semiconductor device to the first adhesive surface of a tape segment.

20. The method of claim 18, wherein the method further includes separating a removable liner covering the first adhesive surface of each tape segment prior to securing each semiconductor device to the first adhesive surface of a tape segment.

21. A method for attaching solder balls to semiconductor devices comprising:

providing a sheet having a plurality of heat-resistant tape segments, each tape segment having a first adhesive surface, the first adhesive surface having a plurality of blind recesses in the tape segment formed on the first adhesive surface, each blind recess having a second adhesive surface therein;

inserting a solder ball into a blind recess of each tape segment, wherein the solder ball adheres to the second adhesive surface;

providing a plurality of semiconductor devices, each semiconductor device having a plurality of bond pads;

securing each semiconductor device to the first adhesive surface of a tape segment, wherein each bond pad of each semiconductor device is aligned with a blind recess of a tape segment containing a solder ball, wherein each tape segment is adapted to secure to one semiconductor device; and heating the solder balls to a temperature at which they reflow and bond to the bond pads, wherein the method further includes separating each tape segment with a semiconductor device secured thereto from the sheet prior to heating the solder balls.

22. A method for attaching solder balls to semiconductor devices comprising:

providing a sheet having a plurality of heat-resistant tape segments, each tape segment having a first adhesive surface, the first adhesive surface having a plurality of blind recesses in the tape segment formed on the first adhesive surface, each blind recess having a second adhesive surface therein;

inserting a solder ball into a blind recess of each tape segment, wherein the solder ball adheres to the second adhesive surface;

providing a plurality of semiconductor devices, each semiconductor device having a plurality of bond pads;

securing each semiconductor device to the first adhesive surface of a tape segment, wherein each bond pad of each semiconductor device is aligned with a blind recess of a tape segment containing a solder ball, wherein each tape segment is adapted to secure to one semiconductor device; and heating the solder balls to a temperature at which they reflow and bond to the bond pads, wherein the method further includes separating each tape segment with a semiconductor device secured thereto from the sheet after heating the solder balls.

23. A method for attaching solder balls to semiconductor devices comprising:

providing a sheet having a plurality of heat-resistant tape segments, each tape segment having a first adhesive surface, the first adhesive surface having a plurality of blind recesses in the tape segment formed on the first adhesive side, each blind recess having a second adhesive surface therein;

inserting a solder ball into a blind recess of each tape segment, wherein the solder ball adheres to the second adhesive surface;

providing a plurality of semiconductor devices, each semiconductor device having a plurality of bond pads;

securing each semiconductor device to the first adhesive surface of a tape segment, wherein each bond pad of each semiconductor device is aligned with a blind recess of a tape segment, wherein each tape segment is adapted to secure to one semiconductor device; and separating a tape segment from the sheet.

24. The method of claim 23, wherein the method further includes separating a removable liner covering the first adhesive surface of each tape segment prior to securing each semiconductor device to the first adhesive surface of a tape segment.

25. The method of claim 23, wherein securing each semiconductor device to the first adhesive surface of a tape segment includes applying a compressive force to the tape segment and the semiconductor device.

26. The method of claim 23, wherein the method further includes coating the bond pads with flux prior to securing each semiconductor device to the first adhesive surface of a tape segment.

27. A method for attaching solder balls to semiconductor devices comprising:

providing a sheet having a plurality of heat-resistant tape segments, each tape segment having a first adhesive surface, the first adhesive surface having a plurality of blind recesses in the tape segment formed in the first adhesive surface, each blind recess having a second adhesive surface therein;

coupling the sheet to an automated conveyor system to convey a tape segment to a solder ball placement apparatus;

aligning the tape segment with the solder ball placement apparatus;

inserting a solder ball from the solder ball placement apparatus into a blind recess of the aligned tape segment, wherein the solder ball adheres to the second adhesive surface;

processing one or more additional tape segments through the alignment with the solder ball apparatus and the insertion of a solder ball from the solder ball placement apparatus into a blind recess of the aligned tape segment, wherein the solder ball adheres to the second adhesive surface;

providing a plurality of semiconductor devices, each semiconductor device having a plurality of bond pads;

securing each semiconductor device to the first adhesive surface of a tape segment, wherein each bond pad of each semiconductor device is aligned with a blind recess of a tape segment, wherein each tape segment is adapted to secure to one semiconductor device; and heating the solder balls to a temperature at which they reflow and bond to the bond pads.

28. The method of claim 27, wherein the method further includes separating a removable liner covering the first adhesive surface of each tape segment prior to securing each semiconductor device to the first adhesive surface of a tape segment.

29. The method of claim 27, wherein coupling the sheet to an automated conveyor system to convey a tape segment to a solder ball placement apparatus includes coupling the sheet to an automated conveyor system where the tape segment is conveyed to the solder ball placement apparatus by moving the solder ball apparatus to the tape segment.

30. The method of claim 27, wherein securing each semiconductor device to the first adhesive surface of a tape segment includes applying a compressive force to the tape segment and the semiconductor device.

31. The method of claim 27, wherein the method further includes costing the bond pads with flux prior to securing each semiconductor device to the first adhesive surface of a tape segment.

32. The method of claim 27, wherein the method further includes removing excess solder balls deposited above the first adhesive surface of a tape segment outside a blind recess.

33. The method of claim 27, wherein inserting a solder ball from the solder ball placement apparatus includes aligning a stencil having apertures over a tape segment such that the apertures align with the bind recesses of the tape segment, wherein each solder ball placed on the stencil falls through an aperture into a bind recess, one solder ball to a blind recess.

34. A method for attaching solder balls to semiconductor devices comprising:

providing a sheet having a plurality of heat-resistant tape segments, each tape segment having a first adhesive surface, the first adhesive surface having a plurality of blind recesses in the tape segment formed on the first adhesive side, each blind recess having a second adhesive surface therein;

coupling the sheet to an automated conveyor system to convey a tape segment to a solder ball placement apparatus;

aligning the tape segment with the solder ball placement apparatus;

inserting a solder ball from the solder ball placement apparatus into a blind recess of the aligned tape segment, wherein the solder ball adheres to the second adhesive surface;

processing one or more additional tape segments through the alignment with the solder ball apparatus and the insertion of a solder ball from the solder ball placement apparatus into a blind recess of the aligned tape segment, wherein the solder ball adheres to the second adhesive surface;

providing a plurality of semiconductor devices, each semiconductor device having a plurality of bond pads;

securing each semiconductor device to the first adhesive surface of a tape segment, wherein each bond pad of each semiconductor device is aligned with a blind recess of a tape segment, wherein each tape segment is adapted to secure to one semiconductor device; and heating the solder balls to a temperature at which they reflow and bond to the bond pads, wherein the method further includes separating each tape segment with a semiconductor device secured thereto from the sheet prior to heating the solder balls.

35. A method for attaching solder balls to semiconductor devices comprising:

providing a sheet having a plurality of heat-resistant tape segments, each tape segment having a first adhesive surface, the first adhesive surface having a plurality of blind recesses in the tape segment formed on the first adhesive side, each blind recess having a second adhesive surface therein;

coupling the sheet to an automated conveyor system to convey a tape segment to a solder ball placement apparatus;

aligning the tape segment with the solder ball placement apparatus;

inserting a solder ball from the solder ball placement apparatus into a blind recess of the aligned tape segment, wherein the solder ball adheres to the second adhesive surface;

processing one or more additional tape segments through the alignment with the solder ball apparatus and the insertion of a solder ball from the solder ball placement apparatus into a blind recess of the aligned tape segment, wherein the solder ball adheres to the second adhesive surface;

providing a plurality of semiconductor devices, each semiconductor device having a plurality of bond pads;

securing each semiconductor device to the first adhesive surface of a tape segment, wherein each bond pad of each semiconductor device is aligned with a blind recess of a tape segment, wherein each tape segment is adapted to secure to one semiconductor device; and heating the solder balls to a temperature at which they reflow and bond to the bond pads, wherein the method further includes separating each tape segment with a semiconductor device secured thereto from the sheet after heating the solder balls.

36. A method comprising:
forming a tape for attaching solder balls to an electronic component to form a ball grid array on the electronic component, forming the tape comprising:
providing a heat-resistant film having a first side;
forming a plurality of blind recesses in the first side in the heat-resistant film, each blind recess configured to hold at most one of the solder balls;
applying a first adhesive coating to the first side to form a first adhesive surface, the first adhesive surface adapted to secure the heat-resistant film to the electronic component;
applying a second adhesive coating to each blind recess to form a second adhesive surface therein; and
forming a removable liner on the first adhesive surface, the removable liner having a plurality of perforations aligned with the plurality of blind recesses.

37. The method of claim 36, wherein providing a heat-resistant film includes providing a film having one or more layers of polyimide.

38. The method of claim 36, wherein providing a heat-resistant film includes providing a film containing silicon.

39. The method of claim 36, wherein providing a heat-resistant film includes providing a non-wettable film.

40. The method of claim 36, wherein forming a plurality of blind recesses includes arranging the blind recesses to match an arrangement of connection points on the electronic component.

41. The method of claim 36, wherein forming a plurality of blind recesses includes sizing the plurality of blind recesses such that a solder ball does not protrude beyond the first side when placed in a blind recess.

42. The method of claim 36, wherein forming a plurality of blind recesses includes sizing the plurality of blind recesses such that a solder ball is flush with or protrudes slightly from the first side.

43. The method of claim 36, wherein applying a first adhesive coating to the first side to form a first adhesive surface includes applying a resin that provides a temperature activated adhesive.

44. A method comprising:
forming a tape for attaching solder balls to a semiconductor device to from a ball grid array on the semiconductor device, forming the tape comprising:
providing a heat-resistant first layer having a first side and a second side;
forming a plurality of perforations through the first layer;
applying a first adhesive coating to the first side of the first layer to form a first adhesive surface, the first adhesive surface adapted to secure the heat-resistant first layer to the semiconductor device;
providing a heat-resistant second layer having a third side;
laminating the third side of the second layer to the second side of the first layer, wherein the perforations in the first layer and the third side of the second layer form a plurality of blind recesses, each blind recess configured to hold at most one of the solder balls;
applying a second adhesive to each blind recess forming a second adhesive surface therein; and
forming a removable liner on the first adhesive surface, the removable liner having a plurality of perforations aligned with the plurality of blind recesses.

45. The method of claim 44, wherein forming a plurality of perforations through the first layer includes pattering the perforations to match a predetermined array.

46. The method of claim 44, wherein forming a plurality of perforations through the first layer includes forming the plurality of perforations in the first layer by punching or etching.

47. The method of claim 44, wherein forming a plurality of perforations through the first layer includes forming the plurality of perforations in the first layer by laser cutting.

48. The method of claim 44, wherein laminating the third side of the second layer to the second side of the first layer includes applying heat.

49. The method of claim 44, wherein laminating the third side of the second layer to the second side of the first layer includes applying pressure.

50. A method comprising:
forming a tape for attaching solder balls to a semiconductor device to form a ball grid array on the semiconductor device, forming the tape comprising:
providing a heat-resistant first layer having a first side and a second side;
forming a plurality of perforations through the first layer;
applying a first adhesive coating to the first side of the first layer to form a first adhesive surface the first adhesive surface adapted to secure the heat-resistant first layer to the semiconductor device;
providing a heat-resistant second layer having a third side;
laminating the third side of the second layer to the second side of the first layer using a second adhesive, wherein the perforations in the first layer and the third side of the second layer form blind recesses configured to hold the solder balls, each blind recess configured to hold at most one solder ball, the third side in each blind recess forming a second adhesive surface therein; and
forming a removable liner on the first adhesive surface, the removable liner having a plurality of perforations aligned with the plurality of blind recesses.

51. The method of claim 50, wherein forming a plurality of perforations through the first layer includes patterning the perforations to match a predetermined array.

52. The method of claim 50, wherein forming a plurality of perforations through the first layer includes forming the plurality of perforations in the first layer by laser cutting.

53. A method comprising:
forming a tape for attaching solder balls to semiconductor devices to form ball grid arrays on the semiconductor devices, forming the tape comprising:
providing a heat-resistant sheet;
forming a plurality of tape segments on the sheet, each tape segment having a first side;
forming a plurality of blind recesses on the first side of each tape segment, each blind recess configured to hold at most one of the solder balls;
applying a first adhesive coating to the first side of each tape segment to form a first adhesive surface on each tape segment, the first adhesive surface adapted to secure the first adhesive surface to one of the semiconductor devices;
applying a second adhesive coating to each blind recess to form in each tape segment a second adhesive surface therein; and
forming a removable liner on the first adhesive surface of each tape segment, the removable liner having a plurality of perforations aligned with the plurality of blind recesses.

54. The method of claim 53, wherein forming a plurality of blind recesses on the first side of each tape segment includes patterning the blind recesses to match a predetermined array.

55. The method of claim 53, wherein the method further includes forming side rails in the sheet, the side rails having indexing features to be used in aligning the sheet.

56. The method of claim 55, wherein forming side rails having indexing features includes forming side rails having holes.

57. The method of claim 53, wherein forming a plurality of tape segments on the sheet includes forming slots between each tape segment.

58. The method of claim 53, wherein the method further includes forming a pair of shear lines, the shear lines running along opposite sides of the tape segments.

59. A method comprising:
forming a tape for attaching solder balls to semiconductor devices to from ball grid arrays on the semiconductor devices, forming the tape comprising:
providing a heat-resistant first sheet layer having a first side and a second side;
forming a plurality of perforations through the first sheet layer;
applying a first adhesive coating to the first side of the first sheet layer to form a first adhesive surface;
providing a heat-resistant second sheet layer having a third side;
laminating the third side of the second sheet layer to the second side of the first sheet layer, wherein the perforations in the first sheet layer and the third side of the second sheet layer form a plurality of blind recesses, each blind recess configured to hold at most one of the solder balls;
applying a second adhesive to each blind recess forming a second adhesive surface therein;
partitioning the first sheet layer to foam a plurality of tape segments, each tape segment having a portion of the first adhesive surface and a portion of the blind recesses such that the portion of the first adhesive surface is configured to secure the tape segment to one of the semiconductor devices; and
forming a removable liner on the first adhesive surface, the removable liner having a plurality of perforations aligned with the plurality of blind recesses.

60. The method of claim 59, wherein laminating the third side of the second sheet layer to the second side of the first sheet layer includes applying heat.

61. The method of claim 59, wherein laminating the third side of the second sheet layer to the second side of the first sheet layer includes using the second adhesive to laminate the third side of the second sheet layer to the second side of the first sheet layer, wherein the perforations in the first sheet layer and the third side of the second sheet layer form blind recesses, the third side in each blind recess forming a second adhesive surface therein.

62. The method of claim 59, wherein the method further includes forming side rails in the sheet, the side rails having indexing features to be used in aligning the sheet.

63. The method of claim 59, wherein partitioning the first sheet layer to form a plurality of tape segments includes forming slots separating each tape segment.

64. The method of claim 59, wherein the method further includes forming a pair of shear lines, the shear lines running along opposite side of the tape segments.

* * * * *

UNITED STATES PATENT AND TRADEMARK OFFICE
CERTIFICATE OF CORRECTION

PATENT NO. : 6,855,623 B2
DATED : February 15, 2005
INVENTOR(S) : Ball, Michael

It is certified that error appears in the above-identified patent and that said Letters Patent is hereby corrected as shown below:

Column 8,
Line 47, delete "preassembled" and insert -- pre-assembled --, therefor.

Column 10,
Line 12, delete "seeming" and insert -- securing --, therefor.
Line 28, delete "coveting" and insert -- covering --, therefor.
Line 59, after "having" insert -- a --.

Column 11,
Line 21, delete "Th" and insert -- The --, therefor.

Column 13,
Line 50, delete "costing" and insert -- coating --, therefor.
Lines 60 and 62, delete "bind" and insert -- blind --, therefor.

Column 15,
Line 45, delete "from" and insert -- form --, therefor.

Column 16,
Line 2, delete "pattering" and insert -- patterning --, therefor.
Line 26, after "surface" insert -- , --.

Column 17,
Line 21, delete "from" and insert -- form --, therefor.

Column 18,
Line 5, delete "foam" and insert -- form --, therefor.

UNITED STATES PATENT AND TRADEMARK OFFICE
CERTIFICATE OF CORRECTION

PATENT NO. : 6,855,623 B2
DATED : February 15, 2005
INVENTOR(S) : Ball, Michael

It is certified that error appears in the above-identified patent and that said Letters Patent is hereby corrected as shown below:

Column 18, (cont'd),
Line 32, delete "side" and insert -- sides --, therefor.

Signed and Sealed this

Ninth Day of August, 2005

JON W. DUDAS
*Director of the United States Patent and Trademark Office*